United States Patent [19]
Buchmann et al.

[11] Patent Number: 5,032,879
[45] Date of Patent: Jul. 16, 1991

[54] INTEGRATED SEMICONDUCTOR DIODE LASER AND PHOTODIODE STRUCTURE

[75] Inventors: Peter L. Buchmann, Langnau am Albis; Christoph S. Harder, Zurich; Otto Vogeli, Ruschlikon, all of Switzerland

[73] Assignee: International Business Machines Corporation, Armonk, N.Y.

[21] Appl. No.: 536,828

[22] Filed: Jun. 11, 1990

[30] Foreign Application Priority Data

Sep. 12, 1989 [EP] European Pat. Off. ........ 89810577.0

[51] Int. Cl.$^5$ ............................................. H01L 31/12
[52] U.S. Cl. ........................................ 357/19; 357/30; 357/17; 357/16; 372/50
[58] Field of Search ............... 357/19, 17, 30 P, 30 D, 357/30 E, 30 G, 30 L, 16; 372/50

[56] References Cited

U.S. PATENT DOCUMENTS 4,698,129 10/1987 Puretz et al. ..................... 156/643
4,736,231 4/1988 Ayabe et al. ..................... 357/19
4,817,109 3/1989 Miyauchi et al. ................ 357/19 X

FOREIGN PATENT DOCUMENTS 3316271 10/1984 Fed. Rep. of Germany ........ 357/19
57-68087 4/1982 Japan ................................... 357/19

OTHER PUBLICATIONS

Nobuhara et al., "One-Chip Optical Transmitter with a Microcleaned Facet Al6a As/GaAs GRIN-SCH SQW Laser," IEEE Journal of Quantum Electronics, vol. QE-23, No. 2, Feb. 1987, pp. 160-163.

Bouadma et al., "GaAs/AlGaAs Ridge Waveguide Laser Monolithically Integrated with a Photodetector Using Ion Beam Etching," Electronics Letters, 30, Jul. 1987, vol. 23, No. 16, pp. 855-857.

Uchida et al., "Integrated AlGaAs Two-Beam LD-PD Array Fabricated by Reactive Ion Beam Etching," Electronics Letters, 22 May 1986, vol. 22, No. 11, pp. 585-587.

Primary Examiner—William Mintel
Attorney, Agent, or Firm—Donald M. Boles

[57] ABSTRACT

An integrated semiconductor structure with optically coupled laser diode (11) and photodiode 12A, both devices having etched, vertical facets (16A, 21). The photodiode has a spatially non-uniform sensitivity profile with respect to the incident light beam (18A) emitted by the laser. This is due to the varying distance from the laser facet and/or to variations in the angle of incidence and results in photocurrents produced by the photodiode that depend on the intensity distribution of the light beam. The spatially non-uniform sensitivity profile allows the measurement of the far-field intensity distribution of the laser and thus on-wafer screening of lasers with respect to their mode stability.

16 Claims, 3 Drawing Sheets

INTEGRATED SEMICONDUCTOR DIODE LASER AND PHOTODIODE STRUCTURE

DESCRIPTION

1. Field of the Invention

The invention concerns a semiconductor structure comprised of an integrated laser diode and a photodiode. The photodiode is used for testing wafer processing and for laser beam monitoring. The photodiode structure is, additionally, designed to measure the far-field intensity distribution of the diode laser light beam and to allow on-wafer screening of lasers with respect to their modal stability.

2. Background of the Invention

Semiconductor laser diodes have found applications in a wide variety of information handling systems, partly because of their compact size and partly because their technology is compatible with that of the associated electronic circuitry. They are presently used in areas such as data communication, optical storage and optical beam printing.

Aiming at an improved device performance and at reducing the cost of fabrication, a strong trend towards integration of opto-electronic devices has emerged. By way of example, diode lasers and monitoring photodiodes have been integrated such that the photodiode is normally positioned facing the back-end facet of the laser diode, the latter being commonly used for monitoring and stabilizing the laser output power. Similar integrated laser diode/photodiode structures have been described in various publications of which the following are representative:

Article "GaAs/AlGaAs Ridge Waveguide Laser monolithically integrated with a Photodetector using Ion Beam Etching", by N. Bouadma et al (Electronics Letters 30 July 1987, Vol. 23 No. 16, pp. 855–857), describes a laser diode that is integrated with a monitoring photodiode. The laser diode and the photodiode have, respectively, vertical and slanted etched facets fabricated with an ion beam etching process. The slated photodiode facet reduces parasitic light reinjection and has no effect on the uniform sensitivity profile of the photodiode.

Article "Integrated AlGaAs Two-Beam Ld-PD Array fabricated by Reactive Ion Beam Etching", by M. Uchida et al (Electronics Letters 22 May 1986, Vol. 22, No. 11, pp. 585–587), discloses a monolithical integrated laser diode/photodiode array which provides a light source of multiple parallel beams, controlled by the photodiodes associated with each laser diode. The laser diodes and photodiodes have vertical facets, parallel to each other, and are formed by reactive ion etching of a groove of about 20 μm width. High coupling efficiency is achieved.

Article "Monolithic Integration of Laser Diodes, Photomonitors, and Laser Driving and Monitoring Circuits on a semi-insulating GaAs", by H. Nakano et al (IEEE Journal of Lightwave Technology, Vol. LT-4 No. 6, June 1986, pp. 574–582), describes an opto-electronic integrated circuit (OEIC) comprising electro-optical devices and associated electronic circuitry. The laser diode and the photodiode are part of the same structure, with the photodiode being operated under reverse-bias condition. The gap between the two devices is obtained by using an etching process that results in vertical, parallel facets. In the set-up described, a second laser diode and photodiode are integrated to check the current-light output characteristics of each device.

Article "AlGaAs OEIC Transmitters", by H Matsueda (IEEE Journal of Lightwave Technology, Vol. LT-5, No. 10, Oct. 1987, pp. 1382–1390). This paper discusses the state of the art of opto-electronic devices. It shows a horizontal structure integrated with a laser diode and a photo monitor for automatic power control. Both devices, separated by a narrow etched groove, share the same cross-section. As in the previous two references, the facets are vertical and parallel to each other.

In these known integrated structures, the photodiodes only provide a measured signal, i.e., the photodiode current is proportional to the total beam power of the associated laser diode. However, the signals do not contain information on the spatial distribution of the beam intensity. Measuring spatial distribution is of great importance for new fabrication processes. During the manufacturing process, the laser mirrors of all devices on a wafer are obtained by etching trenches with the walls serving as mirror facets. This full-wafer processing yields functional parts at the wafer level. This greatly reduces the handling of parts, provided the lasers can also be tested and screened while still on the wafer. This approach is, furthermore, well suited for manufacturing laser diodes, as well as for any devices such as photodiodes, that facilitate testing and monitoring.

An important parameter of a layer that requires testing is the modal stability that affects the noise level (critical in communication system applications) and the beam divergence (critical in power applications). The standard requirement is that only the fundamental mode be present and that it remain stable over the range of operating and driving conditions. Undesired modal changes introduce variations in the intensity distribution of the "far-field" of the laser beam. Therefore, a test structure that is capable of detecting such changes and that can be integrated and manufactured concurrently with the laser is highly desirable, since it allows on-wafer screening of the laser diodes.

Accordingly, it is a main object of the present invention to provide a test structure that allows on-wafer screening of laser diodes against a set of criteria, in particular those related to modal stability and such that they can be incorporated at virtually no extra cost in processing or wafer area.

Another main object is to provide a photodiode to be integrated with an associated laser diode, having a spatially non-uniform light sensitive profile that results in a photocurrent of varying intensity distribution of the light beam impinging on the photodiode.

A further object is to provide a method of screening a plurality of laser diodes formed on a wafer that allows detection of modal instabilities of the laser beams.

SUMMARY OF THE INVENTION

The invention as claimed is intended to meet these objectives. In the inventive structure, a photodiode is optically coupled to the associated laser diode to be tested, and has a spatially non-uniform sensitivity profile with regard to the incident laser light beam. The resulting photocurrent varies with varying intensity distribution of the beam.

In the specific embodiments of the invention to be described hereinafter, the spatially non-uniform sensitivity profiles are obtained by shaping the vertical photodiode facet or by positioning it with respect to the direction of the light beam propagation emitted by the laser. In a first embodiment, the diode surface is non-linear, whereby the distance from the laser light mode region is variable. In a second embodiment, the vertical facet of the diode is tilted with respect to the optical axis of the light beam by the so-called Brewster angle.

The advantages of the present invention mainly reside in that the structure allows detection of variations in the beam intensity distribution and, consequently, of transverse mode transitions. It, furthermore, permits on-wafer assessment of the far-field behavior and comprehensive on-wafer screening of all laser diodes. The new diode design avoids reflection of the laser beam back into the laser.

DESCRIPTION OF THE DRAWINGS

The present invention will become more readily apparent from the following detailed description taken in conjunction with the accompanying drawings in which.

DESCRIPTION OF THE PREFERRED EMBODIMENT

Before describing in greater detail the embodiments of the inventive device, the underlying general concept will be outlined by comparing it to a known integrated laser diode-monitor diode structure. Both use AlGaAs/GaAs technology and etched facet devices. These known structures are described in the aforementioned articles by M. Uchida et al, H. Nakano et al, and H. Matsueda.

Figure 1A:
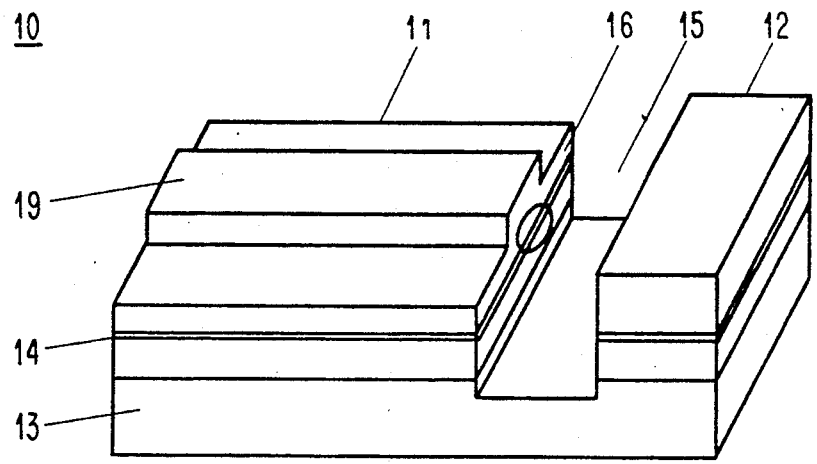
FIG. 1A is a perspective view of a state of the art integrated laser diode/monitor diode structure (prior art)
Figure 1B:
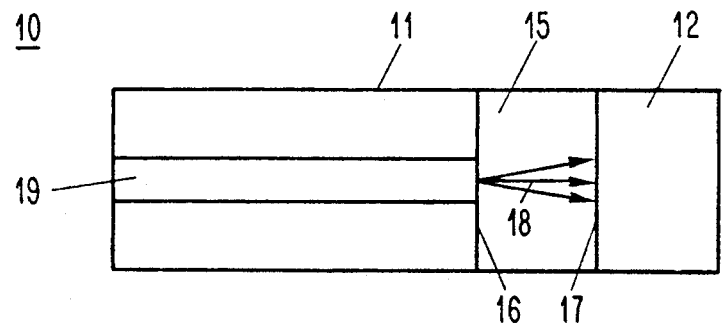
FIG. 1B is a schematic top view of the structure of FIG. 1A (used for illustrating the operational concept)

FIG. 1A is a perspective view of a known laser diode/photodiode structure 10. Only the most relevant elements are shown. FIG. 1B is a further simplified, schematic top view of the same structure.

The main elements of structure 10 are: laser diode 11 and photodiode 12. Both are formed in a stack of layers that are epitaxially grown on a GaAs substrate 13, the stack including at least one active layer sandwiched between cladding layers. For the sake of clarity, only active layer 14 is shown in FIG. 1A. The drawings show the structure after completion of the etch process that forms groove 15. This groove provides the laser mirror facet 16 and the photodiode facet 17. Omitted are the metallized layers that provide electrical contacts to the completed device.

In FIG. 1A, the light mode region of the laser is shown as a small ellipse, centering around active layer 14 and laterally defined by stripe ridge 19. The plurality of arrows 18 in FIG. 1B represent the light beam emitted by the laser impinging on the photodiode facet 17. When the device is activated by applying proper operating voltages, the resulting photocurrent represents the total beam power. It is not affected by change in light beam intensity distribution due to spacially uniform sensitivities. The photodiode 12 is used to monitor the operation of laser 11 and to sense any variations in beam power during the lifetime of the laser. Normally, the (weaker) beam used for monitoring is emitted at the back-end of the laser; whereas the main beam leaves the laser from the opposite front-end.

Figure 2A:
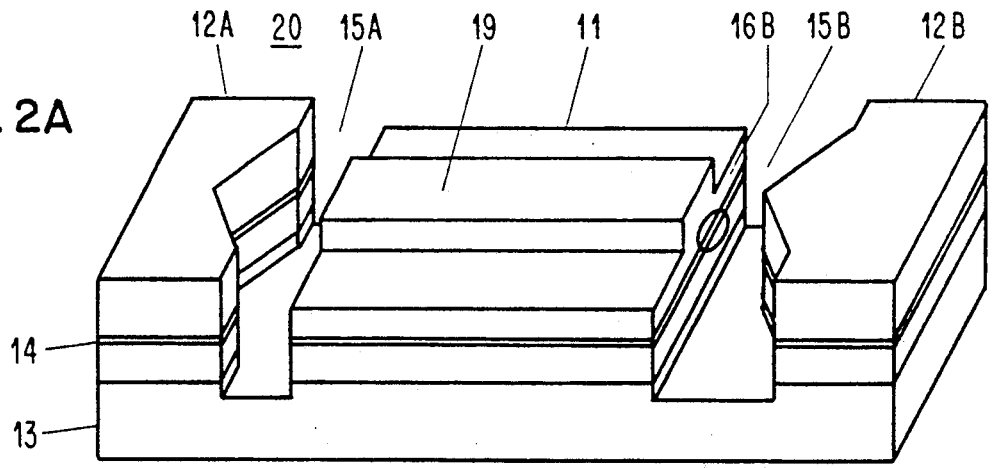
FIG. 2A is a perspective view of a first embodiment of an integrated laser diode/photodiode structure designed in accordance with the present invention.
Figure 2B:
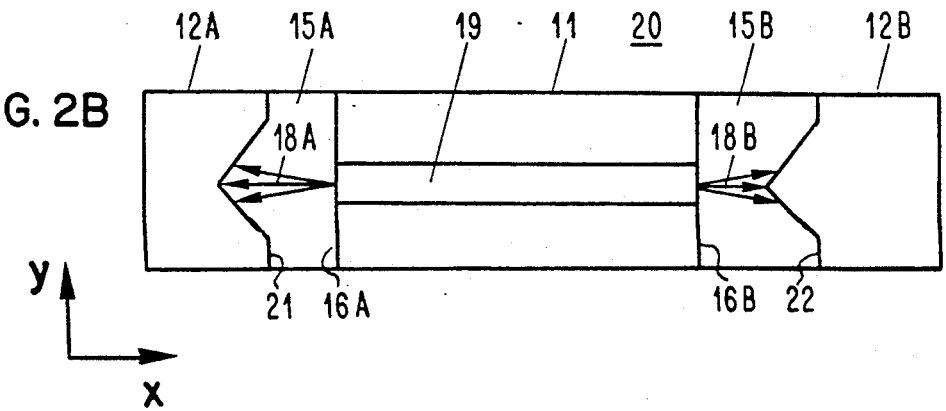
FIG. 2B is a schematic top view of the structure of FIG. 2A (in accordance with the present invention)

FIGS. 2A and 2B illustrate a first embodiment of an integrated diode laser/photodiode 20 designed in accordance with the present invention. The structure comprises a pair of photodiodes 12A and 12B arranged at the front-end and at the back-end of the laser, both with a spatially non-uniform sensitivity profile. Basically, both the laser and the photodiodes are the same structures as those shown of FIG. 1A. Consequently, the same reference numbers have been kept for the same elements. Thus, the structure pairs 12A and 12B, 15A and 15B, etc., correspond to the same elements. It is to be noted that both beams, the front-end and the back-end beam and 18A and 18B are used for testing the laser diode.

The structure 20 of FIG. 2A is distinguished over known devices (illustrated in FIG. 1A) mainly in that the photodiode facets 21 and 22 are shaped, instead of being linear or planar. The profiles of the two facets are mutually inverse to each other. In the present embodiment, facet 21 is concave, whereas facet 22 is convex.

The principle of operation of structure 20 will now be described. The laser beam with divergence D impinging on the photodiode and with a sensitivity region of height h is arranged at a distance $x - s(y)$. At the photodiode facet, the fraction of collected light $\eta(y)$ varies along the horizontal direction y as a function of $s(y)$, as follows:

$$\eta(y) = \frac{1}{D} \times \frac{h}{s(y)}$$

A laser beam with a horizontal intensity profile p(y) induces a diode photocurrent:

$$i(y) \sim \eta(y) \times p(y)$$
$$\downarrow$$

In a planar photodiode facet, $x=s_o$, assuming a small beam divergence D (with an almost perpendicular incidence), $\eta$ remains virtually constant. The output signal is:

$$I \sim \eta \times \int_{-\infty}^{+\infty} p(y) dy$$

Thus, the resulting photodiode current is a function of the total beam power and is independent of the intensity distribution. This current is all that can be measured with known prior art devices. With the shaped facets of the present invention, the collection efficiency varies along y as function of the distance s(y). The output current becomes:

$$I \sim \int_{-\infty}^{+\infty} \eta(y) \times p(y) dy$$

Thus, the output signal depends on the shape of the horizontal intensity profile of the photodiode. Either geometry, facet 21 or 22, can serve as a spatially non-uniform sensitivity sensor—with the photodiode 12A least sensitive at the center, and photodiode 12B most sensitive at the center. However, even when only one of the two photodiodes is used, the output current is still proportional to the beam power and depends only to a smaller extent on the beam shape and on the beam intensity distribution. This is unsatisfactory since changes in intensity distribution need to be tested against beam power (or laser current) variations. In other words, the measured, far-field dependent signal should be insensitive to the total beam power. This is achieved by using the inverse pair of sensors 12A and 12B, one facing the front-end of the laser and the other the back-end If these sensors are used differentially, the differential output signal $I_{diff} = I_{12a} - I_{12b}$ has the desired attribute: it becomes insensitive to the total beam power.

Figure 3:
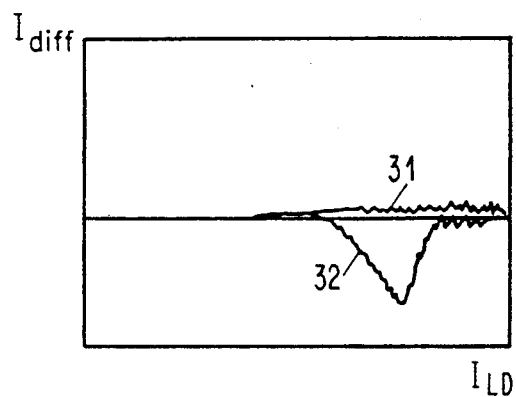
FIG. 3 is an $I_{diff}/I_{LD}$ diagram obtained from measurements of various structures corresponding to FIG. 2A, the curves representing the far-field intensity distribution of various diode lasers.

FIG. 3 shows a diagram in which the differential signal $I_{diff}$ is recorded against laser current $I_{LD}$. Gain adjustments are made to account for the difference in beam power between the front and back-end beam. Plot 31 represents a laser in which the beam intensity distribution does not substantially vary with increased laser current $I_{LD}$. Plot 32, on the other hand, clearly reflects a gradual change in the intensity distribution. With these spatially non-uniform sensitivity-profile photodiodes, changes in laser mode configuration can be detected since modal changes create changes in the light intensity distribution. This implies that lasers can be efficiently tested with regard to modal stability. The usual requirement is that only the fundamental mode be present and that it be stable over the range of driving conditions occurring during operation. Since arrays of the inventive integrated laser diode/photodiode device can be fabricated and tested "on-wafer", the new structure allows for comprehensive full-wafer screening of laser diodes at no additional cost in either processing or wafer area, provided the photodiode is subsequently used as a monitoring diode.

The fabrication process of the integrated laser diode/photodiode structure of FIG. 2A will now be outlined. The epitaxially grown multi-layer which forms the basis for the laser 11 and photodiodes 12A and 12B can structurally be the same and fabricated with the same process as the one described in the article by C. Harder et al, entitled "High-Power Ridge-Waveguide AlGaAs GRINSCH Laser Diode", published in the Electronics Letters of 25 Sept. 1986 Vol. 22, No. 20, pp. 1081-1082 which is specifically incorporated by reference herein. The sequence of steps for producing the stack of layers (not all shown in FIG. 2A) is as follows the layers are grown on an n+-doped GaAs substrate 13, e.g., molecular beam epitaxy (MBE). An n-doped GaAs buffer layer is grown on the substrate, followed by a lower, n-type cladding layer ($Al_{0.45}Ga_{0.55}As$). The core of the laser consists of a graded n-type region (0.2 $\mu$m $Al_{0.45}Ga_{0.55}As$ graded towards $Al_{0.18}Ga_{0.82}As$), an undoped active region 14 forming a quantum well (7 nm GaAs), and a graded p-type region (0.2 $\mu$m $Al_{0.18}Ga_{0.82}As$ graded towards $Al_{0.45}Ga_{0.55}As$). Next is the top p-type cladding layer ($Al_{0.45}Ga_{0.55}As$), followed by a p+-GaAs contact layer with a doping density high enough for a titanium-platinum-gold electrode to make good ohmic contact. Another ohmic contact, at the bottom side of the n-type substrate 13, is obtained by alloying germanium, gold and nickel. If it is required for a lateral waveguide, a ridge 19, about 4 $\mu$m wide, can be formed on top of the structure (see FIG. 2A) prior to applying the metal contact electrodes. This is done by first applying a photoresist mask to define the ridge. Subsequently, 1 to 2 $\mu$m of the exposed top layers are etched, stopping at 0.1 $\mu$m above the graded-index part of the top cladding layer. This is followed by depositing 100 nm of $SiO_2$, lift-off, and, finally removing the $SiO_2$ from the ridge. Mirror grooves 15A and 15B are then etched using a mask and method that, preferably, correspond to those already described in pending European patent application 888,106,135, filed on Sept. 12, 1988. Briefly, this method involves depositing of a three-layer etch mask onto the aforementioned layered structure. The mask consists of two photoresist layers, a hard-baked bottom layer, and a soft-baked top layer with an amorphous dielectric intermediate layer sandwiched in between. The etch pattern, lithographically formed in the top resist layer for the definition of grooves 15A and 15B, is successively transferred; first, the intermediate layer and then, the bottom layer. The intermediate layer is removed prior to etching the mirror groove into the layered structure to prevent erosion. A chemically assisted ion beam etch process (CAIBE) is used to etch the groove, the patterned hard-baked resist layer serving as mask.

Typical dimensions of the structure shown in FIG. 2A are: the length of the laser 11 varies from 600 to 800 $\mu$m; the photodiodes are approximately 100 $\mu$m; the width of both is of the order of 100 to 200 $\mu$m. For the measured device, the distance between the laser facet and the closest point on the shaped photodiode facet is selected to be 6 $\mu$m. The "depth" of the recess (facet 21) and the "height" of the projection (facet 22) are 5 $\mu$m. Other shapes, e.g., rounded rather than edged, can of course also be used. Since the photodiodes are fabricated alongside the lasers, no additional processing cost is incurred. Neither is there any overhead in wafer area if the configuration were designed whereby the photodiodes can serve, first, for part-screening during on-wafer testing and, subsequently, as an integrated monitoring diode during laser use in one of its potential applications. This is accomplished with the integrated structure shown in FIG. 2A with an appropriate layout on the wafer.

Figure 4:
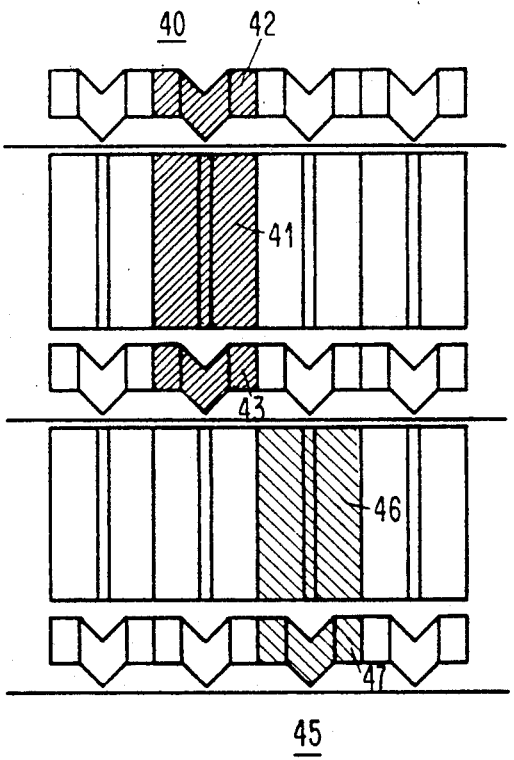
FIG. 4 is a schematic top view of a layout of an array of integrated laser diode/photodiode structures on a wafer, the structures corresponding to those of FIG. 2A.

FIG. 4 shows a schematic top view of a layout of an array of structures essentially corresponding to the structure 20 of FIG. 2A. The only difference is that photodiodes 12A and 12B of neighboring structures be combined back-to-back into single elements corresponding to 43 and 47 of FIG. 4 To screen, e.g., laser 41, the shaded structure 40, consisting of laser 41 and two back-to-back, double-function photodiodes 42 and 43, provide the required differential pair. Each photodiode successively services, two rows of lasers: once, as a front-end sensor for one row, and once, as a back-end sensor for the next row. A single photodiode is sufficient for monitoring purposes when the laser is in use. The laser/photodiode combination consists of laser 46 and photodiode 47. This combination 45 is shown hatched in FIG. 4. It is obtained by dieing the devices on the wafer alongside the cleaving lines "C".

Figure 5A:
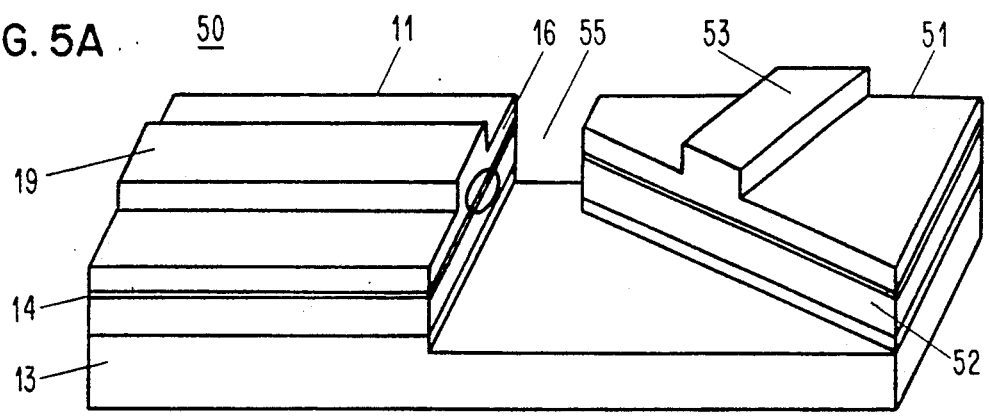
FIG. 5A is a perspective view of another embodiment of an integrated laser diode/photodiode structure designed in accordance with the present invention.
Figure 5B:
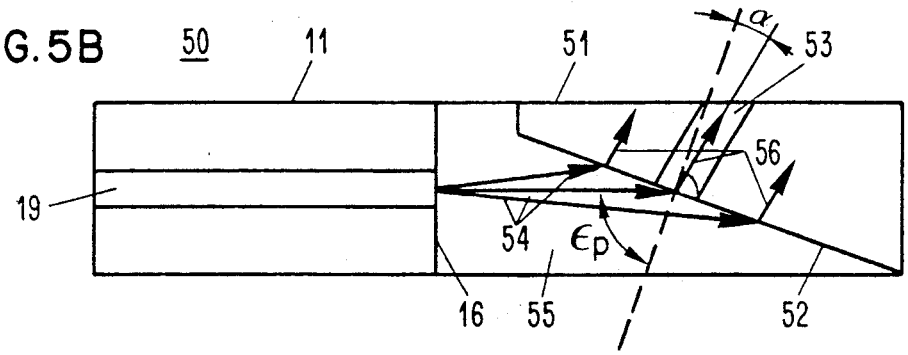
FIG. 5B is a schematic top view of the structure of FIG. 5A.

FIGS. 4A and 5B are illustrations of a second embodiment of an integrated laser diode/photodiode structure designed in accordance with the present invention. The structure 50 comprises a diode laser 11 and a photodiode 51, the latter having a spatially non-uniform sensitivity profile. Basically, the structure of the laser diode 11 and of photodiode 51 are the same as those of the devices shown in FIG. 1A and FIG. 2A.

Figure 6:
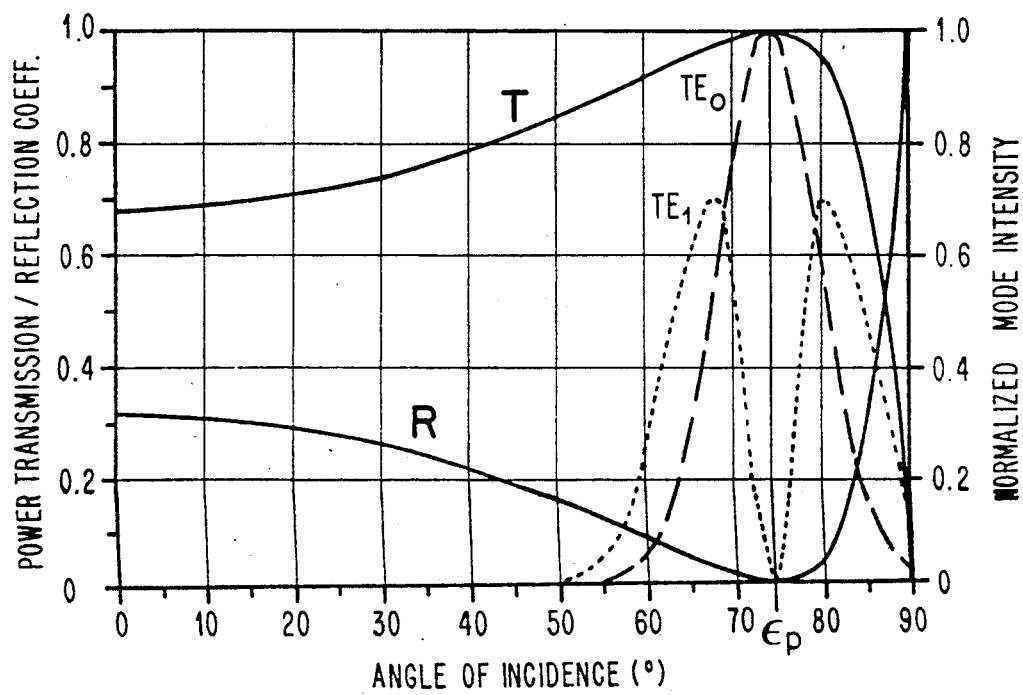
FIG. 6 is a diagram showing the reflection (R) and transmission (T) of an air/GaAs interface versus the angle of incidence of impinging polarized laser light. It also illustrates the intensity distribution of the fundamental and the first order modes of a laser beam.

Structure 50 is distinguished from known devices mainly in that facet 52 of the photodiode 51 is tilted with respect to the propagation direction of the laser beam 54. The tilt angle $\epsilon_p$ is equal to the so-called Brewster angle in which the incident transverse-mode (TM)-polarized (with respect to the tilted photodiode facet) light beam is not reflected but is totally transmitted into the photodiode material (shown by arrows 56). This is illustrated in FIG. 6 showing the reflection P and the transmission T of an air/GaAs interface against the angle of the incidence of the TM-polarized laser light. For GaAs and a wavelength of $\lambda = 0.84$ $\mu$m, the Brewster angle $\epsilon_p$ is 74.4°. The angle can be determined from the handbook "Optical Data Processing", by A. R. Shulman (John Wiley & Sons, Inc., 1970, pp. 92-94).

It becomes apparent from FIG. 6 that maximum transmission occurs at the exact Brewster angle $\epsilon_p$. Any divergence or broadening of the laser beam, as is the case for a laser beam (indicated by arrows 54 of FIG. 5B) results in incident light at anles different than the Brewster angle. Transmission of this light through the tilted photodiode facet into the photodiode structure is reduced, resulting in a spatially non-uniform sensitivity distribution of the photodiode. In other words, structure 50 detects changes in the beam intensity distribution. As with the structure 20 of the embodiment of FIG. 2A, this non-uniform photodiode characteristic can thus be used to detect any switching from the single transverse mode to a higher order mode. This structure 50 can also be used for on-wafer testing.

FIG. 6 shows the intensity distribution curves $TE_0$ and $TE_1$, normalized with respect to the total output power, for the fundamental mode and for the first order mode, respectively. It can be seen from curve $TE_0$ that the fundamental mode is transmitted almost completely through the tilted photodiode facet. The first order mode (curve $TE_1$) displays a minimum in the intensity distribution at the tilting angle. At an angle near the Brewster angle, the overall transmission of light through the photodiode facet is significantly larger for the fundamental mode than that of the first order mode. Since the measured photocurrent is proportional to the light power coupled into the photodiode waveguide, a distinct step in diode photocurrent occurs in the presence of a transverse mode transition. This has been confirmed by measuring the photocurrents $I_{PD}$ of a Brewster-angle tilted-facet photodiode (FIG. 5A) and of a parallel facet photodiode (FIG. 1A). These are integrated at the end of a mode ridge laser as a function of the laser drive current $I_{LD}$.

Figure 7:
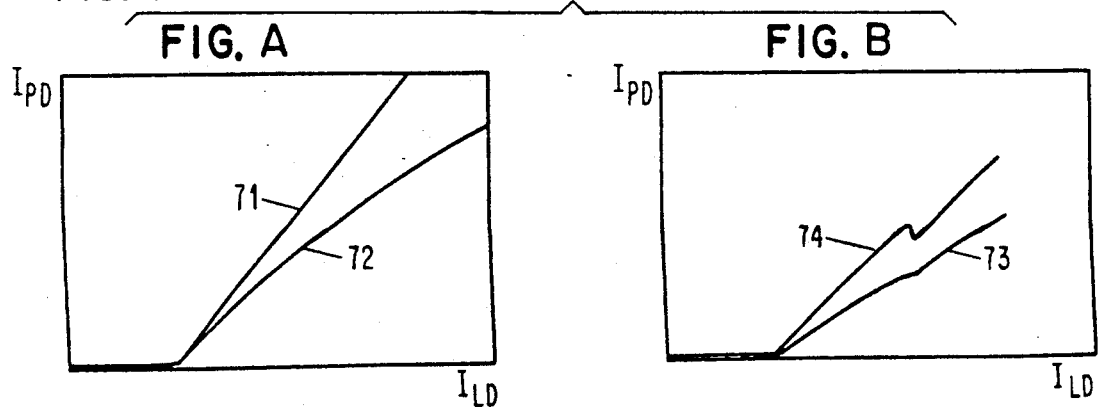
FIG. 7 shows $I_{PD}/I_{LD}$ digrams obtained from (7A) a state-of-the-art laser diode/photodiode structure (as in FIG. 1A), and from (7B) the inventive structure of FIG. 5A. Diagram (7B) illustrates the distinct hump appearing when a change in mode occurs.

FIG. 7A shows the typical behavior of devices where no mode change occurs: a linear increase of the photocurrent in the parallel-facet photodiode (curve 71), and a sublinear characteristic 72 of the Brewster-angle facet photodiode. The behavior of curve 72 corresponds to the beam broadening seen in the far-field of laser beams with increasing power.

FIG. 7B represents the measurement of a laser where a mode-jump occurs. As expected, the signal 74 of the Brewster-angle tilted-facet photodiode shows a distinct step, whereas the signal 73 from the parallel-facet photodiode only shows a hardly recognizable small bump.

It is noted that the curves 72 and 74 reflect measurements of a structure where the photodiode 51 is provided with a ridge waveguide 53 (shown in FIG. 5A and 5B) running parallel to the light transmitted into the photodiode, when impinging onto the photodiode facet 52, at the Brewster angle occurs. The angle $\alpha$ between the axis of the ridge 53 and a line normal to the tilted photodiode facet 52 is 15.6°. The separation of laser and photodiode is relatively large (40 $\mu$m on beam axis) and has yet not been optimized. Shorter distances normally can result in an overall increase in measuring sensitivity.

While only certain embodiments of the present invention have been described, it is apparent to those skilled in the art that various changes and modifications may be made without departing from the spirit and scope of the present invention.

What is claimed is:

1. An integrated semiconductor device, comprising:
    a semiconductor substrate;
    laser diode means with at least one mirror facet on said semiconductor substrate for emitting an impinging light beam;
    at least one photodiode means on said semiconductor substrate optically coupled to said laser diode means and provided with an etched mirror photodiode facet, said at least one photodiode means producing a photocurrent in response to said impinging light beam emitted by said laser diode means; and
    whereby said at least one photodiode means has a spacially non-uniform sensitivity profile with respect to said impinging light beam.

2. The integrated semiconductor device as in claim 1, whereby said laser diode means emits a light beam of constant total power that generates photocurrent at a level related to the intensity distribution of the light impinging onto said at least one photodiode means.

3. An integrated structure as in claim 1, wherein two of said etched mirror photodiode facets are arranged at a distance from each other so as to allow measuring the far-field intensity distribution of said impinging light beam.

4. An integrated structure as in claim 3, wherein said photodiode has a p-n junction and wherein said laser diode is provided with an active waveguide which is coplanar with respect to said p-n junction of said photodiode.

5. An integrated structure as in claim 4, wherein said etched mirror photodiode facet has a non-linear profile, whereby said laser active wave-guide terminates at said at least one mirror facet and whereby said p-n junction of said photodiode terminates at said etched mirror photodiode facet, such that the distance between said terminating laser active waveguide and said terminating p-n junction of said photodiode varies with the angle at which the light is emitted.

6. An integrated structure as in claim 1, wherein said laser diode means has a front end and an adjacent back end, said laser diode means being coupled with two of said photodiodes means facing the front-end and back-end of said laser diode means, respectively.

7. An integrated structure as in claim 6, wherein the etched mirror facet of each of two of said photodiodes have a non-linear profile, said non-linear profiles being mutually inverse with respect to the distance between said terminating laser active waveguide and a p-n junction of each of two of said photodiodes.

8. An integrated structure as in claim 5, wherein opposite facets of two of said photodiodes have a non-linear profile, and where said non-linear profiles of said opposite facets are mutually inverse.

9. An integrated structure as in claim 1, wherein said photodiode facet has a linear profile which is tilted at an angle with respect to the propogation direction of the laser beam.

10. An integrated structure as in claim 9, wherein said tilt angle is equal to a Brewster angle ($\epsilon p$) and such that the portion of the incident transverse-mode polarized light that is transmitted to said photodiode, reaches its maximum.

11. An integrated structure as in claim 10, wherein the photodiode is provided with a waveguiding ridge running above and parallel to the path taken by the polarized light that is transmitted into said photodiode when the angle of incidence of the laser light equals the Brewster angle.

12. A method of on-line wafer testing of the far-field beam characteristics of a plurality of laser diodes, comprising the steps of:
a) providing on a semiconductor wafer a plurality of laser diodes, each of said laser diodes integrated with at least one photodiode, having a spacially non-uniform facet, optically coupled with one of said laser diodes such that, said photodiode, when activated, produces a photocurrent in response to an impinging light beam emitted by said laser diode;
b) successively applying operating voltage to said laser diodes, resulting in the emission of an impinging light beam; and
c) activating said optically coupled photodiode in order to convert said impinging light into a photocurrent, thus providing a test signal with an amplitude that is a function of the far-field intensity distribution of the impinging light beam.

13. A method as in claim 12 wherein the laser diodes are integrated and optically coupled with two of said at least one photodiode wherein, prior to step b, said photodiodes are positioned so as to receive the impinging light beam such that the difference in photocurrent of said photodiodes provides a signal that is independent of the total power of said impinging light.

14. An integrated structure as in claim 6, wherein each facet of two of said photodiodes facing a front-end and a back-end, respectively, of said laser diode have a polygonal profile wherein said polygonal profiles are mutually inverse to each other.

15. An integrated structure as in claim 14, wherein a vertex of said polygonal profile faces said terminating laser active waveguide.

16. An integrated structure as in claim 8, wherein said non-linear profiles of said opposite facets are convex and concave, respectively.

* * * * *